(12) United States Patent
Lee

(10) Patent No.: US 7,590,022 B2
(45) Date of Patent: Sep. 15, 2009

(54) ELECTRIC FUSE CIRCUIT PROVIDING MARGIN READ FUNCTION

(75) Inventor: Byeong-Hoon Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 311 days.

(21) Appl. No.: 11/623,575

(22) Filed: Jan. 16, 2007

(65) Prior Publication Data

US 2007/0183244 A1 Aug. 9, 2007

(30) Foreign Application Priority Data

Feb. 3, 2006 (KR) .................... 10-2006-0010839

(51) Int. Cl.
*G11C 17/18* (2006.01)
(52) U.S. Cl. .................... 365/225.7; 365/96; 365/201; 365/203
(58) Field of Classification Search .............. 365/225.7, 365/96, 201, 203
See application file for complete search history.

(56) References Cited

U.S. PATENT DOCUMENTS

| | | | |
|---|---|---|---|
| 4,995,004 A * | 2/1991 | Lee | ................ 365/189.11 |
| 6,590,825 B2 | 7/2003 | Tran et al. | |
| 6,654,272 B2 | 11/2003 | Santin et al. | |
| 6,775,189 B2 | 8/2004 | Lin et al. | |
| 7,333,383 B2 * | 2/2008 | Vogelsang | ................ 365/225.7 |

FOREIGN PATENT DOCUMENTS

KR    1020030047785 A    6/2003

* cited by examiner

*Primary Examiner*—Son Dinh
*Assistant Examiner*—Nam Nguyen
(74) *Attorney, Agent, or Firm*—F. Chau & Assoc., LLC

(57) ABSTRACT

An electric fuse circuit including a first nonvolatile memory cell connected to a first bit line, a second nonvolatile memory cell connected to a second bit line, a latch connected to the first and second bit lines, and a bias current circuit supplying one of the first and second bit lines with variable bias currents through the latch in response to a bias control signal during a test operation.

16 Claims, 4 Drawing Sheets

ELECTRIC FUSE CIRCUIT PROVIDING MARGIN READ FUNCTION

CROSS-REFERENCE TO RELATED APPLICATION

This patent application claims priority under 35 U.S.C. § 119 of Korean Patent Application No. 2006-10839 filed on Feb. 3, 2006, the entire contents of which are hereby incorporated by reference.

BACKGROUND

The present disclosure relates to semiconductor memory devices and, more particularly, to a fuse circuit using nonvolatile memory cells.

Semiconductor devices (or semiconductor chips) usually employ fuses for storing optional information for the purpose of altering design patterns or selecting specific options after the manufacturing of their chips. It is generally known that fuse circuits simply operate to connect or disconnect signals or power lines, relevant to functional circuits, to and from each other. Furthermore, it is possible to store required information or modify design configurations by combining connections and disconnections with the fuse circuits.

One of the typical methods for implementing fuse circuits is to utilize laser fuses. In this kind of fuse circuit, fuses are formed by a pattern of polysilicon bars and are melted away by irradiating a laser thereon according to the particular needs. More specifically, both ends of the polysilicon fuse, which is made of a conductive material, are initially electrically connected together and then disconnected after the laser cuts the connection therebetween, or are electrically isolated from each other. By way of such a procedure, the fuse circuit is controlled between the state of connection and disconnection. On the other hand, it is restrictive such that the cut-off operation should be carried out by the laser during a wafer-level test before packaging. Furthermore, the laser fuses are usually cut off after the chip moves to special laser equipment that is different from the equipment used for evaluating the electrical characteristics of the chip, which also incurs an increase of a test time. A further problem is that once the fuses are cut off, there is no way of recovering their original connections due to the physical property of a laser fuse. Moreover, the laser fuses occupy an area larger than a predetermined space relative to the actual circuit on the chip and need a pad option for cutting, so that they occupy a large layout area on the semiconductor chip.

In an approach to overcoming the aforementioned inconvenience involved in laser fuses, there are mostly used electric fuse circuits formed of nonvolatile memory cells. Generally, an electric fuse circuit includes a pair of nonvolatile memory cells that are maintained in a complementary condition with each other through an electrical erasing or programming operation. As the electric fuse circuit retains information about options in the complementary relation with threshold voltages of the two nonvolatile memory cells, it is highly important for the circuit to retain its original information, even for a relatively long time. More specifically, one of the nonvolatile memory cells should be conditioned to have its threshold voltage lower than a reference level, even after a time, while the other should be maintained with its threshold voltage higher than the reference level. Thus, it is properly essential to estimate preservability of information in the electric fuse circuit even after a relatively long time has elapsed.

SUMMARY OF THE INVENTION

Exemplary embodiments of the present invention provide an electric fuse circuit for reading margins of threshold voltages of nonvolatile memory cells.

An exemplary embodiment of the present invention provides an electric fuse circuit comprising: a first nonvolatile memory cell connected to a first bit line; a second nonvolatile memory cell connected to a second bit line; a latch connected to the first and second bit lines; and a bias current circuit supplying one of the first and second bit lines with variable bias currents through the latch in response to a bias control signal during a test operation.

In an exemplary embodiment, the first and second nonvolatile memory cells are commonly controlled by a word line.

According to an exemplary embodiment, the bias current circuit supplies one of the first and second bit lines with the variable bias current in accordance with a voltage of the bias control signal during the test operation.

In an exemplary embodiment, the bias current circuit comprises: a first PMOS transistor connected between a power source voltage and the latch, responding to the bias control signal; and a second PMOS transistor connected between the power source voltage and the latch, responding to the bias control signal.

According to an exemplary embodiment, the electric fuse circuit further comprises: a first discharge circuit setting the second bit line to a ground voltage during the test operation for estimating a margin of a threshold voltage of the first nonvolatile memory cell; and a second discharge circuit setting the first bit line to a ground voltage during the test operation for estimating a margin of a threshold voltage of the second nonvolatile memory cell.

In an exemplary embodiment, the electric fuse circuit further comprises a precharge circuit configured to precharge the first and second bit lines in response to a precharge control signal.

According to an exemplary embodiment, the electric fuse circuit further comprises inverters, each connected to the first and second bit lines.

In an exemplary embodiment, the electric fuse circuit further comprises a switch connected between the latch and the first and second bit lines, operating in response to a switch control signal.

According to an exemplary embodiment, the first and second nonvolatile memory cells are each controlled by corresponding word lines.

In an exemplary embodiment, each of the first and second nonvolatile memory cells is formed of one selected from among an EEPROM cell, a flash memory cell, and a split-gate memory cell.

A further understanding of the nature and advantages of exemplary embodiments of the present invention herein may be realized by reference to the remaining portions of the specification and the attached drawings.

BRIEF DESCRIPTION OF THE FIGURES

Exemplary embodiments of the present invention will be understood in more detail from the following descriptions taken in conjunction with the attached figures. In the figures.

DETAILED DESCRIPTION OF EXEMPLARY EMBODIMENTS

Figure 1:
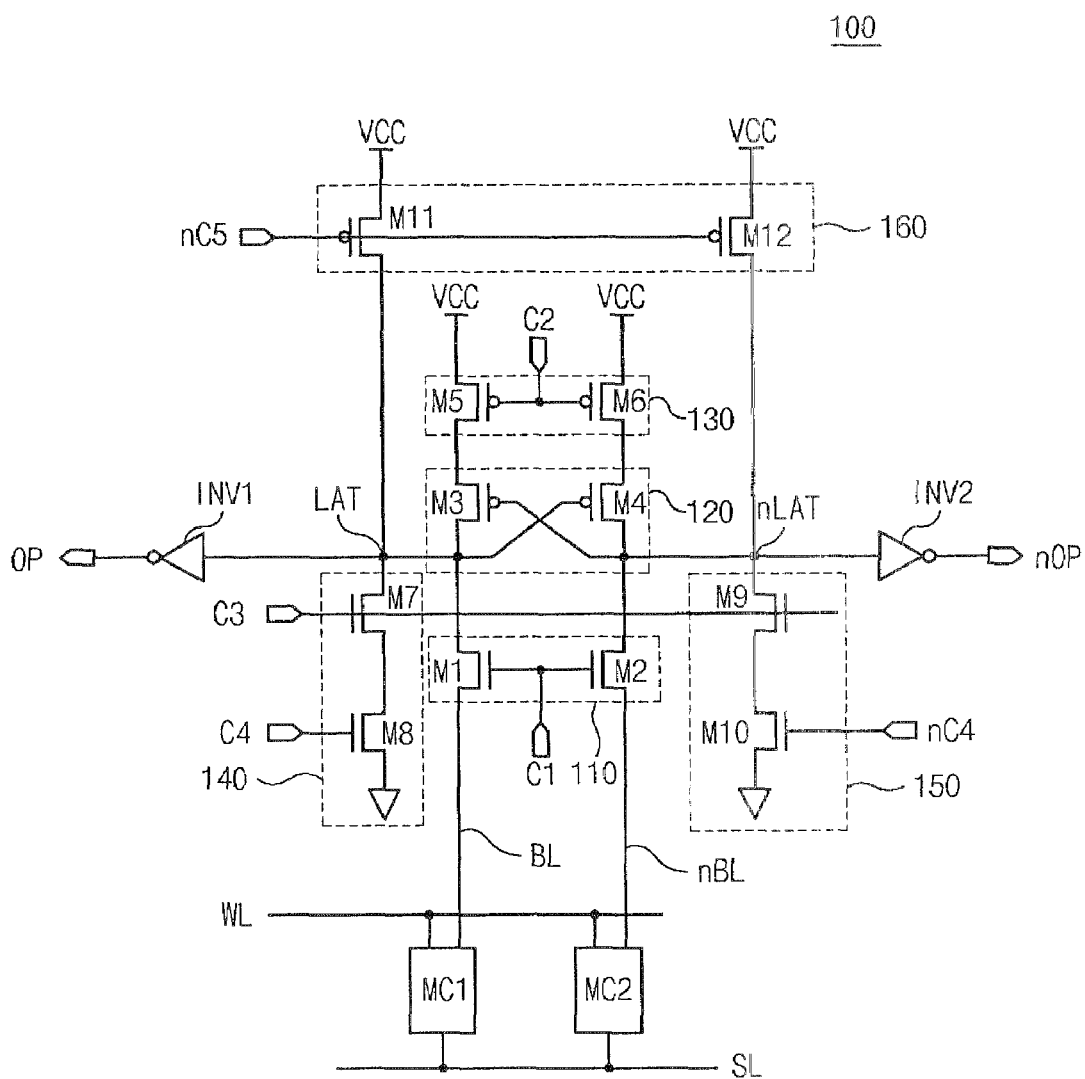
FIG. 1 is a circuit diagram illustrating an electric fuse circuit in accordance with an exemplary embodiment of the present invention.

Exemplary embodiments of the present invention will be described below in more detail with reference to the accompanying drawings, adopting an electric fuse circuit with nonvolatile memory cells as an example for illustrating structural and functional features provided by the present invention. The present invention may, however, be embodied in different forms and should not be constructed as limited to the exemplary embodiments set forth herein. Rather, these exemplary embodiments are provided so that this disclosure will be thorough and complete, and will fully convey the scope of the present invention to those skilled in the art. Like reference numerals refer to like elements throughout the accompanying figures.

Hereinafter, will be described an exemplary embodiment of the present invention in conjunction with the accompanying drawings.

FIG. 1 is a circuit diagram illustrating an electric fuse circuit in accordance with an exemplary embodiment of the present invention. Referring to FIG. 1, the electric fuse circuit 100 is comprised of nonvolatile memory cells MC1 and MC2. Each of the nonvolatile memory cells MC1 and MC2 may be implemented in an electrically erasable and programmable read-only memory (EEPROM) cell, a flash memory cell, a split-gate memory cell, or so on, not restrictive hereto. In this example, the nonvolatile memory cells MC1 and MC2 may be formed of EEPROM cells.

As illustrated in FIG. 1, the electric fuse circuit 100 is comprised of a switch 110, a latch 120, a bias current circuit 130, first and second discharge circuits 140 and 150, a precharge circuit 160, and inverters INV1 and INV2.

The switch 110 is composed of NMOS transistors M1 and M2, connecting bit lines BL and nBL, which correspond to latch nodes LAT and nLAT, with the electric fuse circuit 100 in response to a switch control signal C1. The NMOS transistor M1 is composed of a source connected to the nonvolatile memory cell MC1 through the bit line BL, a drain connected to the latch node LAT, and a gate coupled to the switch control signal C1. The NMOS transistor M2 is composed of a source connected to the nonvolatile memory cell MC2 through the bit line nBL, a drain connected to the latch node nLAT, and a gate coupled to the switch control signal C1. The latch 120 is composed of PMOS transistors M3 and M4, latching logical levels of the latch nodes LAT and nLAT. The PMOS transistor M3 whose gate is coupled to the latch node nLAT has a current path interposed between the bias current circuit 130 and the latch node LAT. The PMOS transistor M4 whose gate is coupled to the latch node LAT has a current path interposed between the bias current circuit 130 and the latch node nLAT.

The bias current circuit 130 is configured to supply variable bias currents to the sources of the PMOS transistors M3 and M4, which constitute the latch 120, in response to a bias control signal C2. The bias current circuit 130 is composed of PMOS transistors M5 and M6. The PMOS transistors M5 and M6 have their gates coupled to the bias control signal C2. The PMOS transistor M5 is comprised of a source connected to a power source voltage VCC and a drain connected to the source of the PMOS transistor M3. The PMOS transistor M6 is comprised of a source connected to a power source voltage VCC and a drain connected to the source of the PMOS transistor M4. A voltage level of the bias control signal C2 is variable, during a test operation, to vary the amount of currents supplied to the latch nodes LAT and nLAT through the latch 120.

In FIG. 1, the first discharge circuit 140 is composed of NMOS transistors M7 and M8 configured to discharge the latch node LAT in response to control signals C3 and C4. The NMOS transistors M7 and M8 are connected between the latch node LAT and a ground voltage in series, being respectively controlled by the control signals C3 and C4. The second discharge circuit 150 is composed of NMOS transistors M9 and M10 configured to discharge the latch node nLAT in response to control signals C3 and nC4. The NMOS transistors M9 and M10 are connected between the latch node nLAT and the ground voltage in series, being respectively controlled by the control signals C3 and nC4. The control signal nC4 is complementary to the control signal C4. The precharge circuit 160 is configured to precharge the latch nodes LAT and nLAT in response to a precharge control signal nC5, and includes PMOS transistors M11 and M12. The PMOS transistor M11 is connected between the power source voltage VCC and the latch node LAT, and responds to the precharge control signal nC5. The PMOS transistor M12 is connected between the power source voltage VCC and the latch node nLAT, and responds to the precharge control signal nC5. The inverters INV1 and INV2 are respectively coupled to the latch nodes LAT and nLAT.

According to the electric fuse circuit 100 of the exemplary embodiment of the present invention, it is permissible, during a test operation, to find where threshold voltages of the nonvolatile memory cells MC1 and MC2 are located or distributed by way of controlling the amount of currents supplied through the bias current circuit 130. In other words, it is possible to estimate read margins of the nonvolatile memory cells MC1 and MC2.

Figure 2:
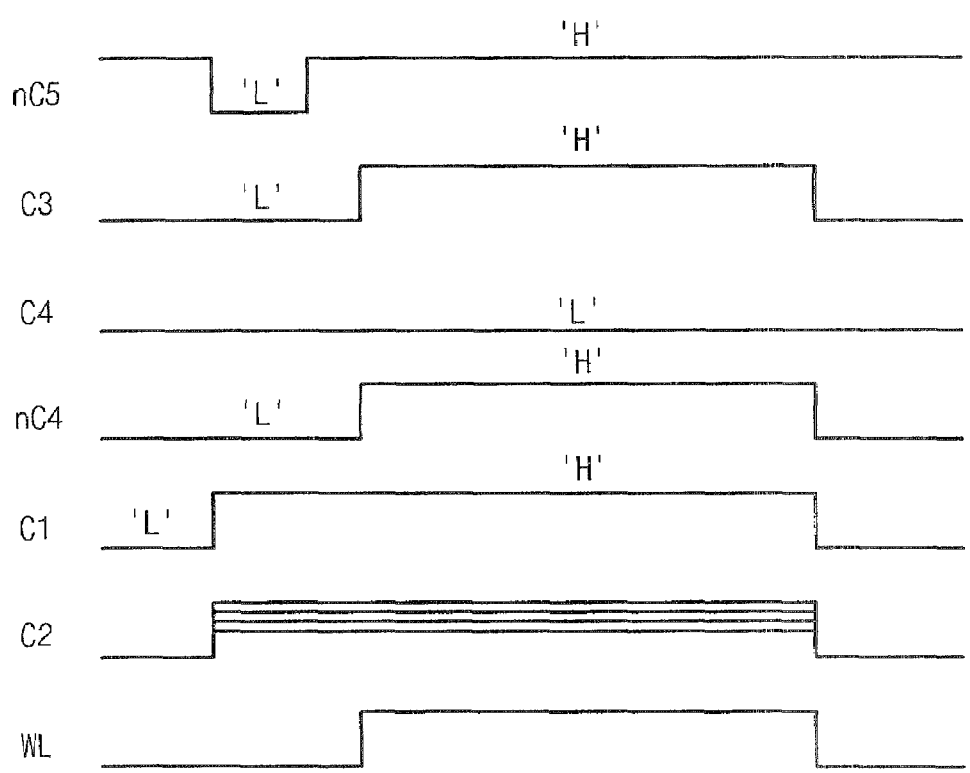
FIG. 2 is a timing diagram showing a test operation of the electric fuse circuit of the exemplary embodiment of the present invention.

FIG. 2 is a timing diagram showing the test operation of the electric fuse circuit of an exemplary embodiment of the present invention. Hereinafter details about the test operation by the electric fuse circuit will be set forth with reference to the drawings.

As aforementioned, in the condition that the nonvolatile memory cells are to be erased and programmed, it is important to find positions or distributions of threshold voltages of the erased/programmed cells. This is because information stored in the electric fuse circuit must be maintained without variation for a relatively long time to provide assurance. For this, estimating read margins of the erased and programmed nonvolatile memory cells is required. The read margins of the nonvolatile memory cells are estimated by way of the following process in an exemplary embodiment.

First, the control signal nC5 is activated to a low level to precharge the latch nodes LAT and nLAT through the PMOS transistors M11 and M12, respectively. During this, the control signal C1 becomes active to a high level, which makes the bit lines BL and nBL precharged to VCC-Vth (Vth is a threshold voltage of the NMOS transistor) through the NMOS transistors M1 and M2, respectively. After precharging the latch nodes and the bit lines, the control signal nC5 is inactivated to the high level to turn the PMOS transistors M11 and M12 off. Next, the control signals C3 and nC4 are activated to high levels, while the control signal C4 is maintained on its inactive state. With the activation of the control signals C3 and nC4 to high levels, the latch node nLAT is connected to the ground voltage through the discharge circuit 150. Then, an output nOP of the inverter INV2 is set to a high level. This operation makes the latch node nLAT set to a low level regardless of the state (erased or programmed) of the nonvolatile memory cell MC2.

At the same time, a word line WL coupled to the nonvolatile memory cells MC1 and MC2 is activated. The bit line nBL is maintained at the ground voltage regardless of the state of the nonvolatile memory cell MC2, and a voltage of the bit line BL is variable in accordance with the state of the nonvolatile memory cell MC1. A more detailed explanation about this procedure is as follows.

Assuming that the nonvolatile memory cell MC1 has been erased or programmed, the control signal C2 is controlled in voltage to vary an amount of current flowing through the PMOS transistor M5. For instance, when a current (hereinafter, referred to as 'cell current') flowing through the nonvolatile memory cell MC1 is larger than a current (hereinafter, referred to as 'bias current') flowing through the PMOS transistor M5, a voltage of the latch node LAT is set lower than a trip voltage of the inverter INV1. Namely, an output OP of the inverter INV1 becomes the high level. Again, the control signal C2 varies to increase the bias current. During this, the output OP of the inverter INV1 is maintained at the high level or goes to a low level. If the output OP of the inverter INV1 is maintained at the high level, the control signal C2 varies to increase the bias current. On the contrary, if the output OP of the inverter INV1 goes to the low level from the high level, that is, if the bias current is larger than the cell current, it is possible to find a position of a threshold voltage of the nonvolatile memory cell MC1 through the bias current and a voltage of the word line. In other words, it is possible to estimate a read margin of the nonvolatile memory cell MC1.

According to the exemplary embodiment described above, there is no information about whether the nonvolatile memory cell MC1 is erased or programmed. Except, however, because an amount of the bias current is variable in accordance with a state of the nonvolatile memory cell, it is possible to find where a threshold voltage of the nonvolatile memory cell is positioned (or to find a read margin of the nonvolatile memory cell), by means of the aforementioned procedure regardless of the state of the nonvolatile memory cell.

A test operation of the nonvolatile memory cell MC2 is substantially same as the above-described procedure, except that the control signal C4 is activated instead of the control signal nC4, so this will not be described in further detail.

A read margin between the nonvolatile memory cells MC1 and MC2 can be found from detecting positions of the threshold voltage of the nonvolatile memory cells MC1 and MC2, by means of the above-described procedure, after setting the first nonvolatile memory cell MC1 in an erased or programmed state, while setting the second nonvolatile memory cell MC2 in a programmed or erased state.

In the above-described test operation, it is possible to detect read margins of the nonvolatile memory cells by varying the bias current in the condition of fixing the word line to a voltage (higher than a threshold voltage of the programmed cell). On the other hand, it is also possible to detect read margins of the nonvolatile memory cells by varying a voltage of the word line in the condition of erasing and programming the nonvolatile memory cells and fixing the bias current, for example, an on-cell current or off-cell current, at a constant rate.

Figure 3:
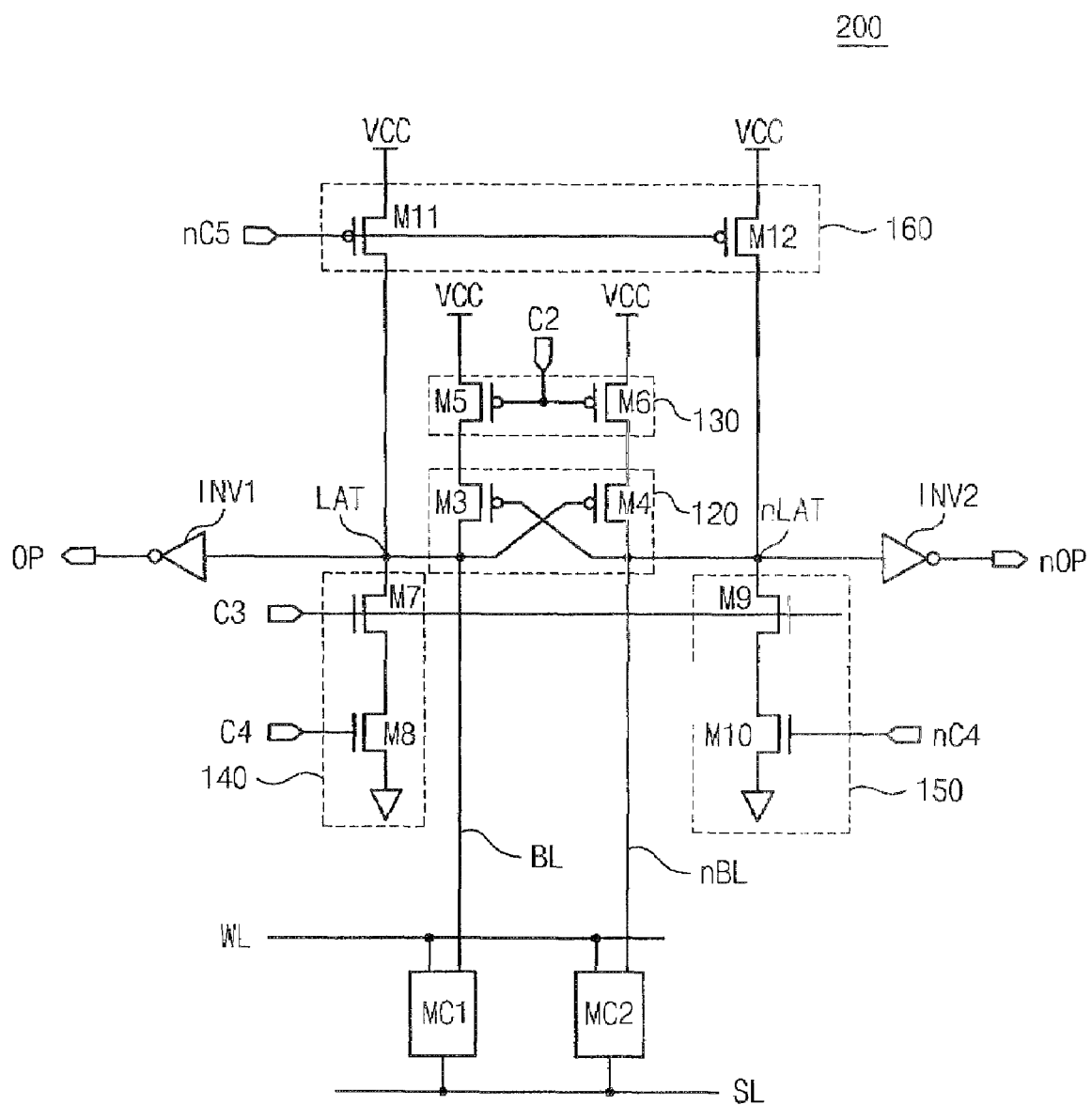
FIGS. 3 and 4 are circuit diagrams illustrating electric fuse circuits in accordance with exemplary embodiments of the present invention.

FIG. 3 is a circuit diagram illustrating an electric fuse circuit in accordance with an exemplary embodiment of the present invention. In FIG. 3, elements functioning the same as those shown in FIG. 1 are identified by the same reference numerals, so they will not be further described. The electric fuse circuit 200 shown in FIG. 3 is substantially the same with as that shown in FIG. 1, except that the switch 110 of FIG. 1 is removed therefrom.

Figure 4:
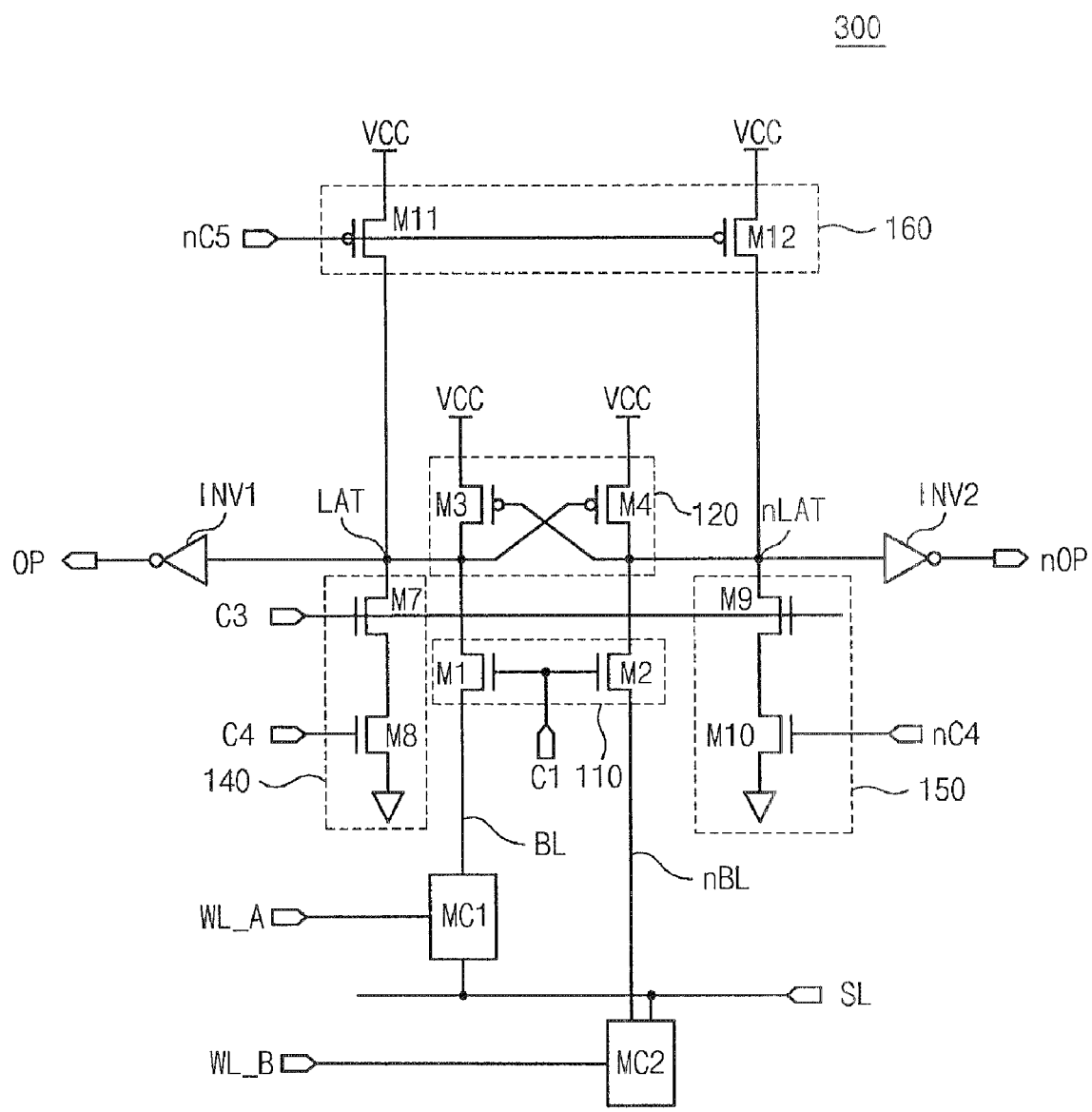

FIG. 4 is a circuit diagram illustrating an electric fuse circuit in accordance with an exemplary embodiment of the present invention.

In FIG. 4, elements functioning as same as those shown in FIG. 1 are identified by the same reference numerals, so they will not be further described. The electric fuse circuit 300 shown in FIG. 4 is substantially the same as that shown in FIG. 1, except that the bias current circuit 130 is removed therefrom and two word lines WL_A and WL_B are used therein. Without the bias current circuit 130 of FIG. 3, the PMOS transistors M3 and M4 of the latch 120 are directly connected to the power source voltage VCC. With the two word lines WL_A and WL_B, the word line WL_A is coupled to the nonvolatile memory cell MC1 while the word line WL_B is coupled to the nonvolatile memory cell MC2. In this case of using the two word lines WL_A and WL_B, it is also possible to find a difference between threshold voltages of the nonvolatile memory cells MC1 and MC2. For example, in the condition that the nonvolatile memory cell MC1 is erased while the nonvolatile memory cell MC2 is programmed, a voltage of the word line WL_A falls down while a voltage of the word line WL_B rises. While varying voltages of the word lines WL_A and WL_B, it is possible to find a difference between threshold voltages of the nonvolatile memory cells MC1 and MC2 from by variations on outputs of the inverters INV1 and INV2, respectively.

Although not shown, it will be understood by those skilled in the art that the electric fuse circuit 300 shown in FIG. 4 may also be formed including the bias current circuit 130 of FIG. 1.

As described above, exemplary embodiments of the present invention provide a function that is able to estimate read margins of the nonvolatile memory cells by finding positions of threshold voltages of the nonvolatile memory cells constituting the electric fuse circuit. Moreover, it is possible to detect a difference between threshold voltages of the nonvolatile memory cells of the electric fuse circuit.

The above-disclosed subject matter is to be considered illustrative, and not restrictive, and the appended claims are intended to cover all such modifications, enhancements, and other exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electric fuse circuit comprising:
   a first nonvolatile memory cell connected to a first bit line;
   a second nonvolatile memory cell connected to a second bit line;
   a latch connected to the first and second bit lines; and
   a bias current circuit supplying one of the first and second bit lines with variable bias currents through the latch in response to a bias control signal during a test operation,
   wherein the first and second nonvolatile memory cells are electrically programmable.

2. The electric fuse circuit as set forth in claim 1, wherein the first and second nonvolatile memory cells are commonly controlled by a word line.

3. The electric fuse circuit as set forth in claim 1, wherein the bias current circuit supplies one of the first and second bit lines with the variable bias current in accordance with a voltage level of the bias control signal during the test operation.

4. The electric fuse circuit as set forth in claim 3, wherein the bias current circuit comprises:
   a first PMOS transistor connected between a power source voltage and the latch, responding to the bias control signal; and
   a second PMOS transistor connected between the power source voltage and the latch, responding to the bias control signal.

5. The electric fuse circuit as set forth in claim 1, further comprising:
   a first discharge circuit setting the second bit line to a ground voltage during the test operation for estimating a margin of a threshold voltage of the first nonvolatile memory cell; and
   a second discharge circuit selling the first bit line to a ground voltage during the test operation for estimating a margin of a threshold voltage of the second nonvolatile memory cell.

6. The electric fuse circuit as set forth in claim 1, further comprising:
   a precharge circuit configured to precharge the first and second bit lines in response to a precharge control signal.

7. The electric fuse circuit as set forth in claim 1, further comprising:
   inverters respectively connected to the first and second bit lines.

8. The electric fuse circuit as set forth in claim 1, further comprising:
   a switch connected between the latch and the first and second bit lines, and operating in response to a switch control signal.

9. The electric fuse circuit as set forth in claim 1, wherein the first and second nonvolatile memory cells are respectively controlled by corresponding first and second word lines.

10. The electric fuse circuit as set forth in claim 1, wherein each of the first and second nonvolatile memory cells is formed of one of an EEPROM cell, a flash memory cell, and a split-gate memory cell.

11. An operating method of an electrical fuse including first and second nonvolatile memory cells, comprising:
    supplying a bit line connected to a selected memory cell between the first and the second nonvolatile memory cells with a bias current;
    comparing the bias current with a cell current that flows through the selected memory cell; and
    detecting a threshold voltage of the selected memory cell based on the comparing result,
    wherein the first and the second nonvolatile memory cells are electrically programmable.

12. The operating method as set forth in claim 11, wherein comparing the bias current with the cell current comprises:
    increasing the bias current while maintaining a word line voltage corresponding to the selected memory cell.

13. The operating method as set forth in claim 12, wherein detecting the threshold voltage comprises:
    detecting whether the bias current is larger than the cell current.

14. The operating method as set forth in claim 11, wherein comparing the bias current with the cell current comprises:
    varying a word line voltage corresponding to the selected memory cell while maintaining the bias current.

15. The operating method as set forth in claim 11, wherein the first and the second nonvolatile memory cells store complementary data.

16. The operating method as set forth in claim 15, further comprising:
    detecting a threshold voltage of a remaining memory cell between the first and the second nonvolatile memory cells; and
    detecting a read margin of the first and the second nonvolatile memory cells based on the detected threshold voltages.

* * * * *